United States Patent
Hu et al.

(10) Patent No.: US 8,907,301 B1
(45) Date of Patent: Dec. 9, 2014

(54) GAS MIXTURE METHOD FOR GENERATING ION BEAM

(71) Applicant: Advanced Ion Beam Technology, Inc., Hsinchu (TW)

(72) Inventors: Koulin Hu, Gilroy, CA (US); Zhimin Wan, Sunnyvale, CA (US); Wei-Cheng Lin, Hsinchu (TW)

(73) Assignee: Advanced Ion Beam Technology, Inc., Hsinchu (TW)

( * ) Notice: Subject to any disclaimer, the term of this patent is extended or adjusted under 35 U.S.C. 154(b) by 0 days.

(21) Appl. No.: 14/017,451

(22) Filed: Sep. 4, 2013

(51) Int. Cl.
*H01J 27/00* (2006.01)
*H01J 27/02* (2006.01)

(52) U.S. Cl.
CPC .................................. *H01J 27/022* (2013.01)

USPC .......... 250/424; 250/423; 250/427; 250/428; 250/281; 250/282; 250/283; 250/300; 250/396

(58) Field of Classification Search
USPC ......... 250/424, 423, 427, 428, 281–283, 300, 250/396
See application file for complete search history.

(56) References Cited

U.S. PATENT DOCUMENTS

2010/0270517 A1* 10/2010 Hong et al. .............. 252/519.33
2013/0140473 A1*  6/2013 Colvin et al. .............. 250/492.3

* cited by examiner

*Primary Examiner* — Jack Berman
*Assistant Examiner* — Meenakshi Sahu
(74) *Attorney, Agent, or Firm* — Rosenberg, Klein & Lee

(57) ABSTRACT

A gas mixture method for generating an ion beam is provided here. By dynamically tuning the mixture ratio of the gas mixture, lifetime of the ion source of an ion implanter can be prolonged. Accordingly, quality of ion beam can be maintained and maintenance fee is reduced.

14 Claims, 3 Drawing Sheets

GAS MIXTURE METHOD FOR GENERATING ION BEAM

BACKGROUND OF THE INVENTION

1. Field of the Invention

The present invention relates to a gas mixture method for generating an ion beam, and more particularly to a method prolonging lifetime of an ion source for generating an ion beam.

2. Description of the Prior Art

Electronic products bring convenience to humans' life and all these products rely on controller chips for operation. Semiconductors have desired electrical properties and thus are widely used for manufacturing chips. Generally, semiconductor wafers need to be doped with chemical elements to reach different electrical properties for different uses. For example, n-type semiconductors can be doped with electron donors (e.g. Group V elements) to increase concentration of free electrons and it affords rise in conductivity.

Currently, ion implanting process is mainly adopted by industry for doping because it can depose ions onto wafer surface homogeneously. An ion implanter system comprises a gas source, a reaction chamber, magnets, and extraction electrodes. While the dopant gas is injected into the chamber, electrons emitted from the hot cathode collide with gas molecules to generate ions. Then magnets establish a magnet field to confine those electrons to prevent them from striking the reaction chamber before colliding with gas molecules, thus to increase electron density and the plasma density. Extraction electrodes placed adjacent to the aperture of the reaction chamber extract the ions out of the plasma to form an ion beam outside the chamber along a desired trajectory. Species of dopant gases contribute to electrical presence of doped wafers such as n-type semiconductors or p-type semiconductors and may comprise $AsH_3$, $GeF_4$, $BF_3$, $CO_2$, CO, $PH_3$ etc. The reaction chamber which accommodates the anode, cathode, reactant gases is called ion source. Stable and uniform ion beam generated from the ion source is required. However, quality of the ion beam may degrade after operating in a period of time; the interval between operation failures is called mean time between failures (MTBF) or lifetime and is considered a critical factor regarding doping process. Larger MTBF value usually indicates better durability of the ion source.

Operation failure may result from several factors. For example, since plasma (ionized gas) is formed in the chamber, positive ions also can possibly accelerate to bombard the cathode to dissociate metal materials of the cathode, such as W (tungsten) or Mo (molybdenum), thereby etching away the cathode material to shorten cathode lifetime. However, if we add some fluorine containing gases, such as $CF_4$, the halogen effect caused by fluorine ions can move W or Mo materials from the chamber wall back to the cathode surface (i.e. halogen cycle). As we can see, the mixture ratio between dopant gas and fluorine containing gas (one of minor gases) is critical to the competing processes of oxidation on W or Mo cathode surfaces versus W or Mo re-deposition on W or Mo cathode surface. Appropriate adjustment of the mixture ratio contributes to best performance and durability of the ion source.

Fluorine containing gases are used to prevent the cathode becoming thinner so as to prolong lifetime of the ion source. However, fixed mixture ratio of $CF_4$ can possibly leads to a negative result. For example, $CF_4$ gas is originally used to enhance halogen effect to maintain cathode size when generating an ion beam. Halogen cycle is a re-deposition process that metal materials evaporating from the cathode or chamber wall bind with halogen gases and return to the cathode. After processing in a period of time, the cathode starts to grow larger and requires higher power to emit electrons. Consequently, it accelerates erosion to the chamber wall due to ion bombardment with higher energy and shortens the lifetime of the ion source. Beneficial influence of adding $CF_4$ is counteracted.

Therefore, a gas mixture method to properly control mixture ratio of the gas mixture needs to be developed to prolong lifetime of the ion source.

SUMMARY OF THE INVENTION

The present invention is directed to a gas mixture method for generating an ion beam. By dynamically tuning mixture ratio of the gas mixture, lifetime of the ion source of an ion implanter can be prolonged.

In one embodiment, a gas mixture method for generating an ion beam comprising: supplying a dopant gas into an ion source chamber of an ion source, wherein the dopant gas is selected from $CO_2$ and CO for generating carbon-containing ions; supplying a minor gas into the ion source chamber to dilute the dopant gas, wherein the minor gas at least comprises $CF_4$; providing a gas mixture of the dopant gas and the minor gas in the ion source chamber to generate the ion beam; and adjusting a mixture ratio of the gas mixture dynamically when generating the ion beam, wherein the mixture ratio is volume ratio and at least the mixture ratio of $CF_4$ is adjusted and the mixture ratio is volume ratio.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENT

The detailed explanation of the present invention is described as follows. The described preferred embodiments are presented for purposes of illustrations and description, and they are not intended to limit the scope of the present invention.

Figure 1:
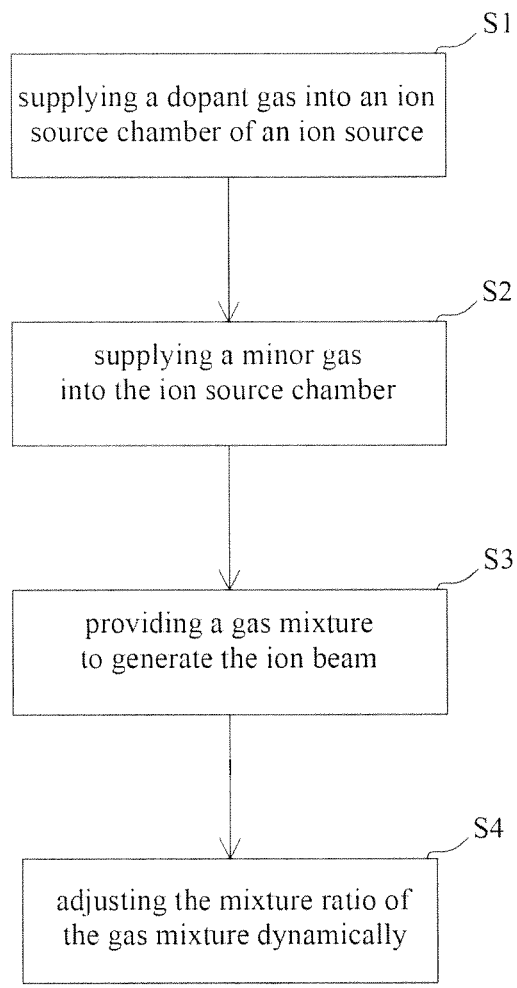
FIG. 1 is a flowchart illustrating a gas mixture method for generating an ion beam according to an embodiment of the present invention.
Figure 2:
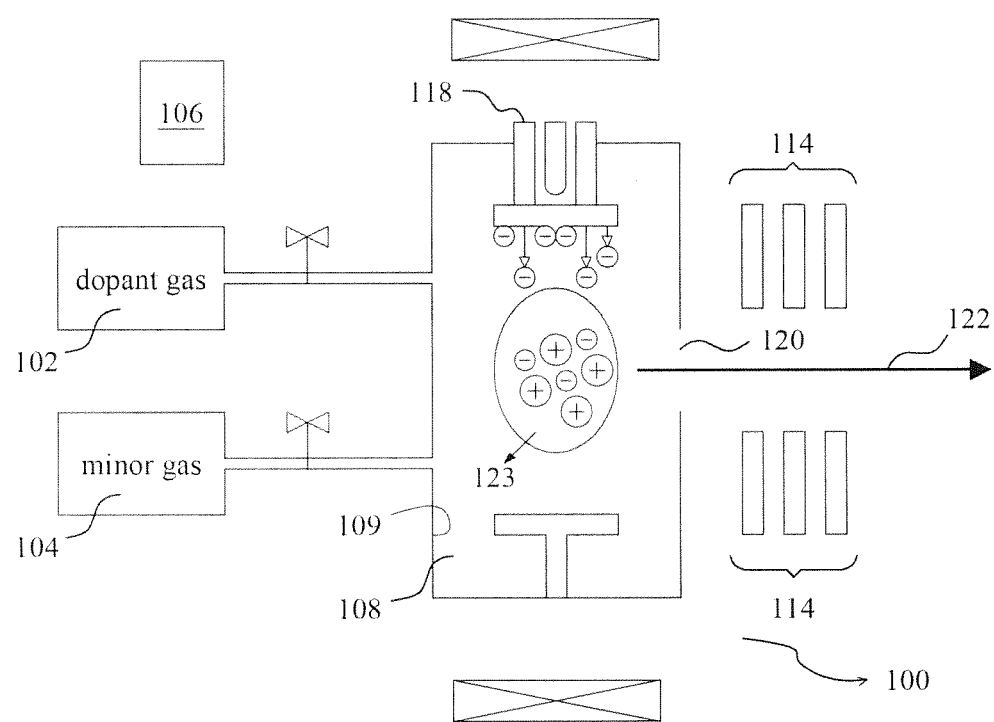
FIG. 2 is a schematic diagram of an ion source of an ion implanter according to an embodiment of the present invention.

Referring to FIG. 1 and FIG. 2, FIG. 1 is a flowchart illustrating a gas mixture method for generating an ion beam according to an embodiment of the present invention and FIG. 2 is a schematic diagram illustrating an ion source of an ion implanter according to an embodiment of the present invention. The gas mixture method comprises several steps. The first step is supplying a dopant gas 102 into an ion source chamber 108 of an ion source 100 (S1). The dopant gas 102 is selected from $CO_2$ and CO for generating carbon-containing ions. The second step is supplying a minor gas 104 into the ion source chamber 108 to dilute the dopant gas 102 (S2). The minor gas 104 at least comprises $CF_4$. The third step is providing a gas mixture of the dopant gas 102 and the minor gas 104 in the ion source chamber 108 to generate an ion beam 122 (S3). The last step is adjusting a mixture ratio of the gas mixture dynamically when generating the ion beam 122 (S4), wherein the mixture ratio is volume ratio and at least the mixture ratio of $CF_4$ is adjusted.

The dopant gas 102 and the minor gas 104 can be mixed by different means. Referring to FIG. 2, in one embodiment, the dopant gas 102 and the minor gas 104 can be directly mixed in the ion source chamber 108. Otherwise, in another embodiment, the gas mixture apparatus further comprises a reservoir 105 (FIG. 3) and the dopant gas 102 and the minor gas 104 can be pre-mixed in the reservoir 105 at the mixture ratio before entering the ion source chamber 108. The dopant gas 102, the minor gas 104 and the reservoir 105 also can be replaced with a gas bottle 105' (not shown in the figures) wherein the dopant gas and minor gas are already pre-mixed at a fixed mixture.

Figure 3:
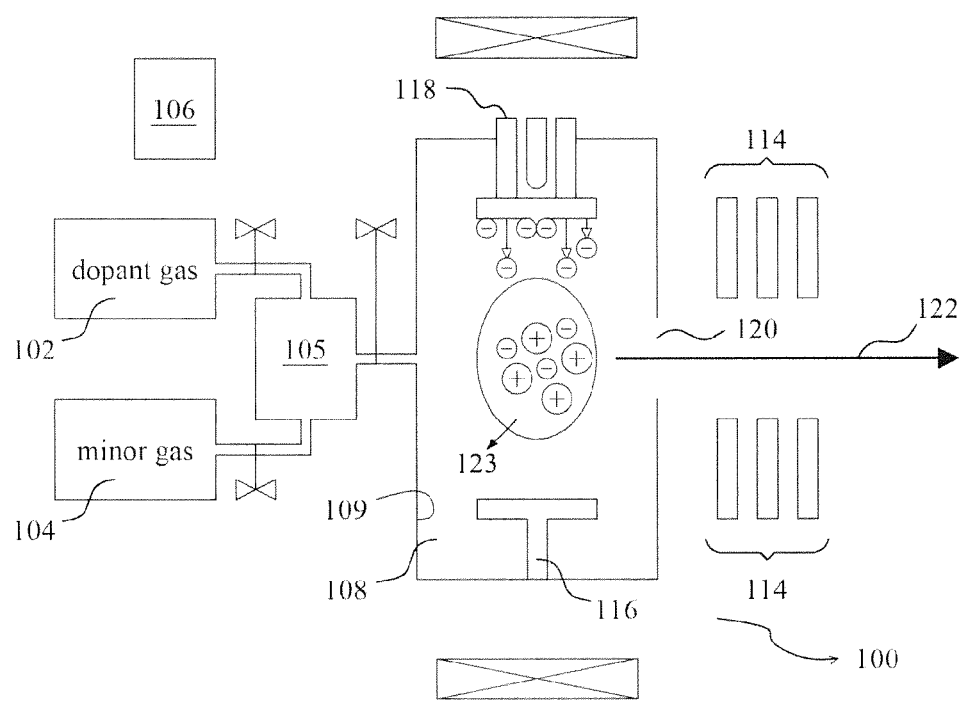
FIG. 3 is a schematic diagram of an ion source of an ion implanter according to another embodiment of the present invention.

In one embodiment, also referring to FIG. 2 and FIG. 3, there is at least one flow controller 106 connected to the ion source to adjust the mixture ratio of the gas mixture.

When generating an ion beam, referring to FIG. 2, in one embodiment, an interior wall 109 of the ion source chamber 108 and a cathode 118 arranged inside the ion source chamber 108 are made of tungsten. In order to emit electrons, the cathode 118 is heated to high temperature and release tungsten atoms (or ions). Meanwhile, fluoride ions (for example, dissipating from $CF_4$) bring tungsten atoms from the inner surface 109 of the ion source chamber 108 to the cathode 118. Movement of tungsten composes halogen cycle and determines the cathode size. Accordingly, the main reason that dynamically adjusting the mixture ratio of the gas mixture is to make a balance between tungsten evaporation from the cathode and tungsten deposition onto the cathode so as to maintain the cathode size. Initially, when the mixture ratio of $CF_4$ is set lower, which indicates that fluorine ions brings less tungsten to the cathode 118, the cathode 118 will not grow thicker. Since the cathode 118 remains the same size, it is unnecessary to apply higher power to generate an ion beam 122; sputtering and erosion to the cathode 118 or to the inner surface 109 of the ion source chamber 108 can be prevented. After operating for a long time, more carbon particles are deposited and accumulated on the inner surface 109 of the ion source chamber 108 and the cathode 118; it affects electric field and ion beam quality. If the mixture ratio of $CF_4$ is set higher, more fluoride ions having very strong oxidation ability can clean the inner surface 109 of the ion source chamber 108 and the cathode 118 to maintain ion beam quality. In this case, the cathode 118 will not be over-eroded because it is balanced by tungsten deposit due to halogen cycle.

On the other hand, adjusting the mixture ratio of $CF_4$ can prevent thinning effect by oxygen ions. Referring to FIG. 2 or FIG. 3, the dopant gas 102, such as CO and $CO_2$, releases carbon-containing ions and oxygen ions as well. After operating for a long time, accumulated oxygen ions having strong oxidation ability in the ion source chamber 108 can erode the chamber wall and the cathode 118, which shortens lifetime of the ions source. It is known that $CF_4$ contributes not only to fluoride ions but also to carbon-containing ions. That is to say, $CF_4$ and the dopant gas 102 such as CO and $CO_2$ are both carbon source of the ion beam 122. Therefore, by properly increasing the mixture ratio of $CF_4$ and reducing the use of CO or $CO_2$, carbon source still can be maintained and quality of the ion beam 122 is not affected. As a consequence, fewer oxygen ions (e.g. $O^{2-}$) are released from CO or $CO_2$; erosion effect caused by oxygen ions can be prevented.

Besides, referring to FIG. 2 or FIG. 3, the slit opening 120 of the ion source chamber 108 and extraction slots 114 right outside may be polluted or sputtered by heavier atoms such as Xe or Kr or by carbon and carbon compounds which are carried by the ion beam 122. To encounter this problem, increasing the mixture ratio of $CF_4$ for generating more fluoride ions to clean the ion beam path makes the ion beam 122 remain uniform.

Regarding other minor gases added inside the ion source chamber 108, $H_2$ and Xe or Kr are also important members. Oxygen ions as mentioned before cause thinning effect to the cathode 118 and $H_2$ introduced here bind with oxygen ions in the form of $H_2O$ or $HO_2$ to be discharged out so as to prevent thinning effect. However, excessive $H_2$ would reduce the ion beam 122 current. Accordingly, when the mixture ratio of $CF_4$ is increased and $CO_2$ or CO is decreased, which means fewer oxygen ions are generated, use of $H_2$ can be reduced.

From another aspect, as we know, heavier noble gases such as Kr and Xe are usually provided to clean the ion source chamber 108, referring to FIG. 2 or FIG. 3. Nevertheless, heavy atomic masses of Kr and Xe can lead to serious sputtering effect to the cathode 118 and the cathode 118 may gradually grows thicker, which deteriorates performance of the ion source. Instead, fluorine ions dissipated from $CF_4$ are adequate to clean the ion source chamber 108. Accordingly, when the mixture ratio of $CF_4$ is increased and $CO_2$ or CO is decreased, use of Kr and Xe can be reduced so as to prevent sputtering effect.

According to aforementioned description, advantages can be obviously seen. By dynamically adjusting the mixture ratio of $CF_4$ and other gases, negative effects after long-term use of the ion source 100 are prevented or alleviated. As a result, lifetime of the ion source 100 can be prolonged, productivity of the ion implanter is improved and maintenance fee is reduced.

Here are some examples given to expound the present invention. In one embodiment, the minor gas further comprises $H_2$, Ar, Xe, or Kr or any combination thereof. The mixture ratio of all these gases can be dynamically adjusted with $CF_4$. For example, the mixture ratio of $CF_4$ varies inversely with that of $CO_2$, $H_2$, and Xe. To be more precise, in one embodiment, the mixture ratio of $CO_2$, $H_2$, Xe, and $CF_4$ is A:X:Y:Z. A ranges from 1.0 to 3.0, X ranges from 0.5 to 1.5, Y ranges from 0.05 to 0.15, and Z ranges from 0.05 to 0.2. For the other case, the mixture ratio of $CF_4$ varies inversely with that of $CO_2$, $H_2$ and Kr. In another embodiment, the mixture ratio of $CO_2$, $H_2$, Kr, and $CF_4$ is A:X:Y:Z. A ranges from 1 to 3, X ranges from 0.5 to 1.5, Y ranges from 0.075 to 0.175, and Z ranges from 0.05 to 2 In another embodiment, the mixture ratio of CO, $H_2$, Xe, and $CF_4$ is A:X:Y:Z. A ranges from 1.0 to 3.0, X ranges from 0.25 to 0.75, Y ranges from 0.05 to 0.15, and Z ranges from 0.05 to 0.2. In another embodiment, the mixture ratio of CO, $H_2$, Kr, and $CF_4$ is A:X:Y:Z. A ranges from 1.0 to 3.0, X ranges from 0.25 to 0.75, Y ranges from 0.075 to 0.175, and Z ranges from 0.05 to 0.2. Examples given above are for the purpose of making the present invention readily understood and should not be deemed to restrict the scope of the present invention. It should be noticed here adjustment range of the mixture ratio, time interval or time point of adjustment and frequency for adjusting the mixture ratio are not limited; the way to adjust the mixture ratio depends on the beam condition or users' requirements. For example, the process of generating the ion beam 122 may be separated into two stages. In the early stage, the mixture ratio of $CF_4$ is set higher and the mixture ratio of $CO_2$, $H_2$, and Xe are set lower while in the late stage, the mixture ratio of $CF_4$ is set lower and the mixture ratio of $CO_2$, $H_2$, and Xe are set higher.

To summarize the foregoing descriptions, the present invention proposes a gas mixture for generating an ion beam. By dynamically adjusting the mixture ratio of the gas mixture, lifetime of the ion source can be prolonged.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A gas mixture method for generating an ion beam comprising:
   supplying a dopant gas into an ion source chamber of an ion source, wherein the dopant gas is selected from $CO_2$ and CO for generating carbon-containing ions;
   supplying a minor gas into the ion source chamber to dilute the dopant gas, wherein the minor gas at least comprises $CF_4$;
   providing a gas mixture of the dopant gas and the minor gas in the ion source chamber to generate the ion beam; and
   adjusting a mixture ratio of the gas mixture dynamically when generating the ion beam, wherein the mixture ratio is volume ratio and at least the mixture ratio of $CF_4$ is adjusted.

2. The gas mixture method according to claim 1, wherein the dopant gas and the minor gas are pre-mixed in a container to form the gas mixture at the mixture ratio before entering the ion source chamber.

3. The gas mixture method according to claim 1, wherein the dopant gas and the minor gas are directly mixed in the ion source chamber to form the gas mixture at the mixture ratio.

4. The gas mixture method according to claim 1, wherein an interior wall of the ion source chamber and a cathode arranged inside the ion source chamber are made of tungsten.

5. The gas mixture method according to claim 1, wherein there is at least one flow controller connected to the ion source chamber to adjust the mixture ratio of the gas mixture.

6. The gas mixture method according to claim 1, wherein the minor gas further comprises $H_2$, Ar, Xe, or Kr or any combination thereof.

7. The gas mixture method according to claim 6, wherein the mixture ratio of $CF_4$ varies inversely with that of $CO_2$, $H_2$ and Xe.

8. The gas mixture method according to claim 6, wherein the mixture ratio of $CO_2$, $H_2$, Xe, and $CF_4$ is A:X:Y:Z, wherein A ranges from 2 to 3.5, X ranges from 0.7 to 1.2, Y ranges from 0.07 to 0.15, and Z ranges from 0.05 to 0.2.

9. The gas mixture method according to claim 6, wherein the mixture ratio of $CF_4$ varies inversely with that of $CO_2$, $H_2$ and Kr.

10. The gas mixture method according to claim 6, wherein the mixture ratio of $CO_2$, $H_2$, Kr, and $CF_4$ is A:X:Y:Z, wherein A ranges from 1.0 to 3.0, X ranges from 0.5 to 1.5, Y ranges from 0.075 to 0.175, and Z ranges from 0.05 to 0.2.

11. The gas mixture method according to claim 6, wherein the mixture ratio of $CF_4$ varies inversely with that of CO, $H_2$ and Xe.

12. The gas mixture method according to claim 6, wherein the mixture ratio of CO, $H_2$, Xe, and $CF_4$ is A:X:Y:Z, wherein A ranges from 1.0 to 3.0, X ranges from 0.25 to 0.75, Y ranges from 0.05 to 0.15, and Z ranges from 0.05 to 0.2.

13. The gas mixture method according to claim 6, wherein the mixture ratio of $CF_4$ varies inversely with that of CO, $H_2$, and Kr.

14. The gas mixture method according to claim 6, wherein the mixture ratio of CO, $H_2$, Kr, and $CF_4$ is A:X:Y:Z, wherein A ranges from 1.0 to 3.0, X ranges from 0.25 to 0.75, Y ranges from 0.075 to 0.175, and Z ranges from 0.05 to 0.2.

* * * * *